United States Patent [19]
Root

[11] Patent Number: 5,744,869
[45] Date of Patent: Apr. 28, 1998

[54] APPARATUS FOR MOUNTING A FLIP-CHIP SEMICONDUCTOR DEVICE

[75] Inventor: Loren Francis Root, Streamwood, Ill.

[73] Assignee: Motorola, Inc., Schaumburg, Ill.

[21] Appl. No.: 567,518

[22] Filed: Dec. 5, 1995

[51] Int. Cl.[6] .......................... H01L 23/48; H01L 23/52
[52] U.S. Cl. .................. 257/778; 257/664; 257/698; 257/728; 257/774
[58] Field of Search ................... 257/698, 774, 257/778, 784, 664, 728

[56] References Cited

U.S. PATENT DOCUMENTS

| | | | |
|---|---|---|---|
| 5,115,300 | 5/1992 | Yanagida et al. | 257/698 |
| 5,166,772 | 11/1992 | Soldner et al. | 257/659 |
| 5,218,234 | 6/1993 | Thompson et al. | 257/787 |
| 5,311,059 | 5/1994 | Banerji et al. | 257/778 |
| 5,334,804 | 8/1994 | Love et al. | 174/267 |
| 5,341,979 | 8/1994 | Gupta | 228/111 |
| 5,347,160 | 9/1994 | Sutrina | 257/784 |
| 5,406,122 | 4/1995 | Wong et al. | 257/753 |
| 5,410,181 | 4/1995 | Zollo et al. | 257/681 |
| 5,435,733 | 7/1995 | Chernicky et al. | 439/68 |
| 5,606,196 | 2/1997 | Lee et al. | 257/784 |

*Primary Examiner*—Tom Thomas
*Assistant Examiner*—David Ostrowski
*Attorney, Agent, or Firm*—Kenneth A. Haas

[57] ABSTRACT

A laser-tunable semiconductor device assembly (LSDA) is provided for electrical connection between multiple semiconductor devices (101, 103) within a RF transistor (100). The LSDA (100) provides for flip-chip type electrical connection between semiconductor devices (101, 103) utilizing solder bumps (503) existing on the semiconductor devices (101, 103) or the LSDA (100). A metalization pattern exists on both sides of the LSDA (100), electrically connected through via holes (403) existing in the LSDA (100). Laser tuning metallic pads (405) are provided for performance matching of the transistor. The use of the LSDA (100) provides for accurate modeling of the electrical connection between semiconductor devices (101, 103), while allowing for "on-line" process control of electrical performance of the transistor and acceptable heat dissipation through the bottom of the semiconductor devices (101, 103).

11 Claims, 3 Drawing Sheets

5,744,869

APPARATUS FOR MOUNTING A FLIP-CHIP SEMICONDUCTOR DEVICE

FIELD OF THE INVENTION

The invention relates generally to semiconductor devices and more particularly to surface mounted flip-chip semiconductor devices in packages.

BACKGROUND OF THE INVENTION

It is common in the design of radio frequency (RF) power transistors and modules to improve device performance and utility by fabricating fixed impedance transformation matching structures using conventional semiconductor chip-and-wire technologies. A typical layout for such a prior-art "matched" power transistor is shown in FIG. 1. In particular, a transistor die 101, and matching metal oxide semiconductor (MOS) capacitors 103 are mounted to a circuit bearing support substrate 105. A combination of impedance transformation and electrical interconnection between the transistor die 101, the matching MOS capacitors 103, and external device contacts 111 on the circuit bearing substrate 105 are completed via wire bonds 107. Many RF transistors 100 may contain in excess of three hundred wire bonds 107 in order to achieve the requisite impedance transformation and electrical interconnections between component parts 101, 103, 105. These wire bonds 107 are attached to semiconductor bonding pads 109 existing on each transistor die 101 and MOS capacitor 103 or to metalization patterns on the circuit bearing substrate 105. Wire bonding techniques are well known and are discussed in, for example, U.S. Pat. No. 5,001,545 issued to Kalfus et al.

In order to efficiently control many electrical parameters in RF transistors (gain, return loss, insertion phase, efficiency, intermodulation, . . . etc.), a variable tuning compensation external to the device is generally required in addition to the "fixed" matching of the device. In particular, a laser trimming operation or similar tuning adjustment such as the mechanical alteration of a microwave stub length or setting of a variable tuned capacitor is usually performed on the external circuit as a final tuning operation once the RF transistor has been electrically connected to a circuit. This inability to fully test the RF transistor until after completion often results in much within-process scrap being generated prior to detection of any problem existing in the assembly process.

Other problems associated with the chip-and-wire impedance matching technology revolve around the modeling challenges associated with the structurally ill-defined wire bonding interconnect and the variability it introduces into the impedance match. While most wire bonding equipment is quite good at placing matching wire bonds at designated locations in an X-Y plane with specified loop heights, there is very little control over the actual cross dimensional wire profile laid out by a wire bonder. FIG. 2 shows an example of this problem. While wire bonds 207 and 205 both connect semiconductor dies 201 and 203, and both have the same loop heights 209, the actual cross dimensional wire profiles differ greatly. This variation in cross dimensional wire profiles makes it extremely difficult to model the self and mutually coupled parasitic inductance and capacitance associated with wire bonds 207, 205.

Other semiconductor devices have eliminated the need for wire bonding by utilizing flip-chip technology. In conventional flip-chip bonding, round or hemispherical solder bumps are formed on the semiconductor substrate bonding pads existing on the top of the semiconductor device. Subsequently, the round or hemispherical solder bumps are mated with corresponding bonding pads on the support substrate (such as a printed circuit board). Flip-chip bumps and bonding techniques are well known and discussed in, for example, U.S. Pat. No. 5,218,234 issued to Thompson et al.

This flip-chip type mounting scheme has typically not been employed in high power RF transistors because of heat removal constraints. In particular, heat removal in high power semiconductor devices is required for proper device operation and component survivability. Usually, this is accomplished by mounting the bottom of the semiconductor die directly to a supporting substrate or heatsink. Since the upside-down "flip-chip" style of semiconductor mounting does not provide for an effective path for heat removal, it can not be used in devices which need to dissipate significant amounts of heat.

Thus a need exists for an apparatus that provides electrical connection in a matched power transistor which is easily modeled, allows for "on-line" process control of the device performance, and also provides the appropriate heat dissipation from the device.

DETAILED DESCRIPTION OF THE INVENTION

The present invention solves the above mentioned problems by replacing the wire bonds with a laser-tunable semiconductor device assembly (LSDA). The LSDA provides for flip-chip type electrical connection between semiconductor devices by utilizing solder bumps existing on the semiconductor devices or LSDA itself. A metalization pattern exists on both sides of the LSDA, electrically connected through via holes existing in the LSDA. Laser tuning metallic pads are provided for performance matching of the transistor. The use of the LSDA provides for accurate modeling of the electrical connection between semiconductor devices by providing significant reduction in interconnect variability over current chip-and-wire technology. In addition, the use of the LSDA allows "on-line" process control of electrical performance of the transistor and provides acceptable heat dissipation through the back of the semiconductor device.

Generally stated, in one embodiment in accordance with the present invention, the LSDA comprises a device assembly for mounting a semiconductor device comprising a substrate having a first substrate side and a second substrate side. A first substrate metalization pattern exists on the first substrate side, a second substrate metalization pattern exists on the second substrate side. The second substrate metalization pattern makes electrical contact to the first substrate metalization pattern. A plurality of laser tuning structures existing on the first substrate side, make electrical contact to the first and the second substrate metalization patterns. Finally, a semiconductor device is electrically connected to the first and the second substrate metalization patterns via a flip-chip type connection.

Figure 1:
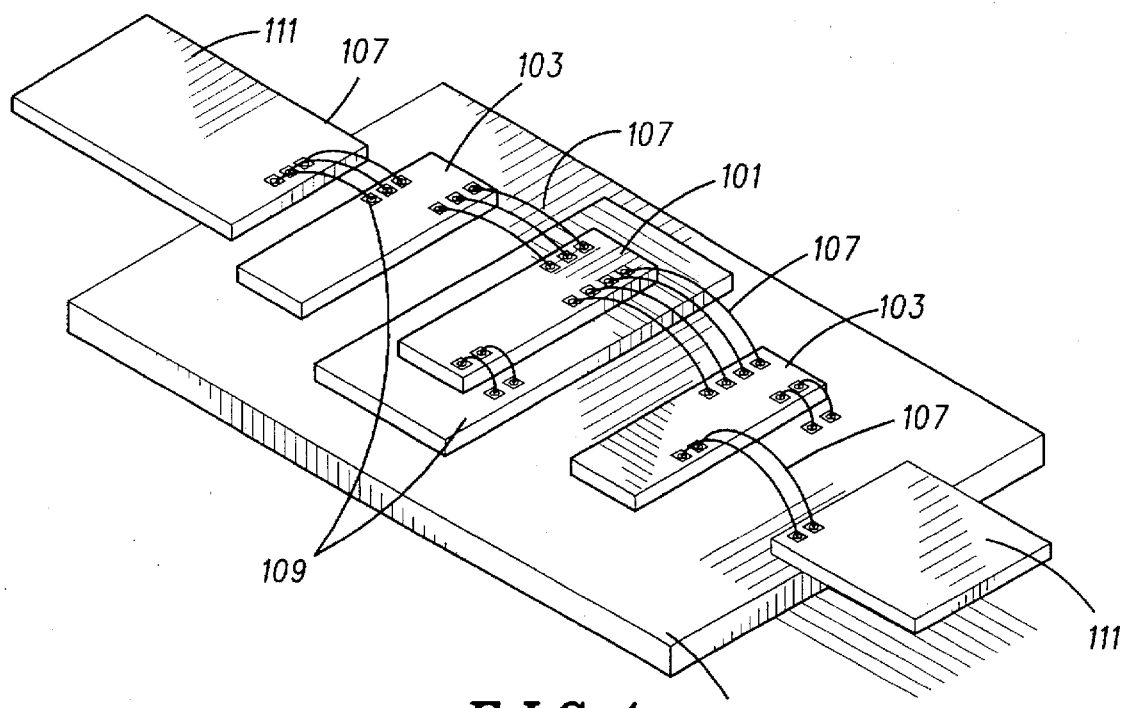
FIG. 1 shows a prior art high-power RF transistor.
Figure 2:
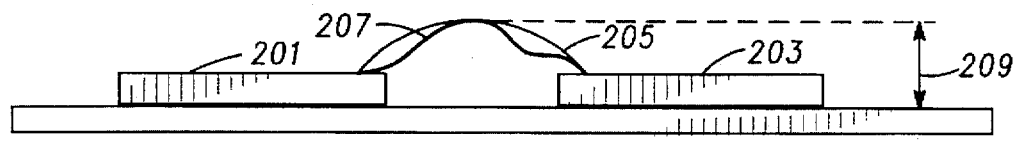
FIG. 2 shows a profile view of typical wire bonds existing between two component parts.
Figure 3:
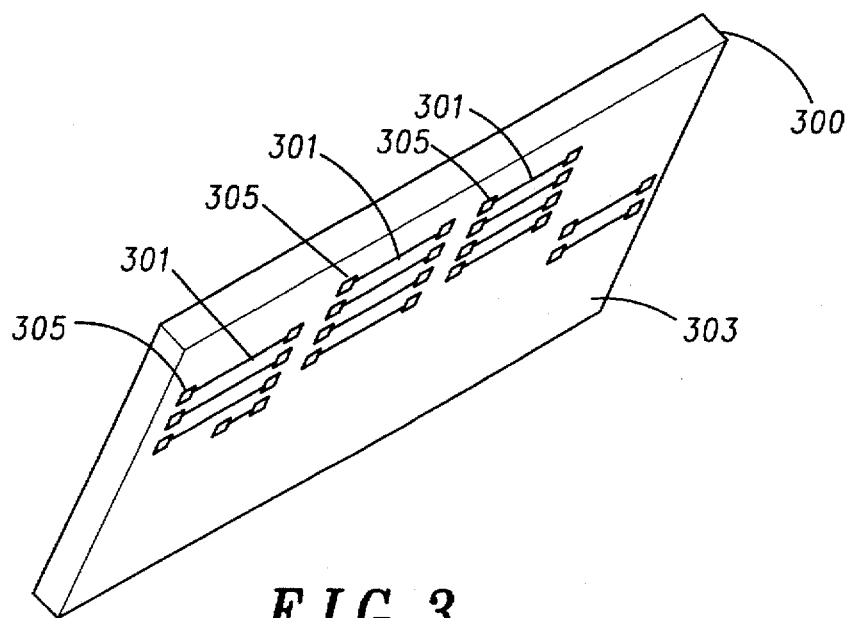
FIG. 3 shows a bottom view of a laser tunable semiconductor device assembly in accordance with a preferred embodiment of the invention.

FIG. 3 shows a bottom view of a LSDA 300 in accordance with a preferred embodiment of the present invention. The LSDA 300 comprises a dielectric insulating material having metalized paths 301 on a bottom surface 303. The metalized paths 301 on the bottom surface 303 serve to make electrical contact between the component parts 101, 103, 105. Further details of the electrical contact are discussed below in reference to FIG. 5. In order to reduce the effects of mismatched coefficients of thermal expansion (CTE) between the semiconductors 101, 103 and the LSDA 300, the LSDA 300 should be manufactured from a material that has a similar CTE to that of the support substrate 105. Additionally, the LSDA 300 should preferably be manufactured from a material that is compatible to laser trimming operations. (Further details of the laser trimming operation are discussed below in reference to FIG. 4). Finally, the LSDA 300 should preferably be manufactured so that the weight of the material is kept low in order for the LSDA 300 to remain suspended above the semiconductors 101, 103 during the attachment process. (Further details of the attachment process are discussed below in reference to FIG. 5). In the preferred embodiment the LSDA 300 is manufactured from the same material as the supporting substrate (such as alumna oxide), although one of ordinary skill in the art will recognize that other materials (aluminum nitride and beryllium oxide for example) may be substituted.

It can be seen in FIG. 3 that the wire bonds 107 of the prior art RF transistor 100 have been replaced by metalized paths 301. In the preferred embodiment, the metalized paths 301 exist on a surface 303 of the LSDA 300, and are applied by a wet photolithographic process, although screen printing, thin film deposition, or photo-imaging using dry film may be substituted. The electrical connection paths terminate on bonding pads 305 that are brought to contact with the semiconductor bonding pads 109 during electrical connection of the semiconductor devices. Replacing the wire bonds 107 with metalized paths 301, allows electrical connections between the semiconductor devices to be easily modeled using existing modeling techniques.

Figure 4:
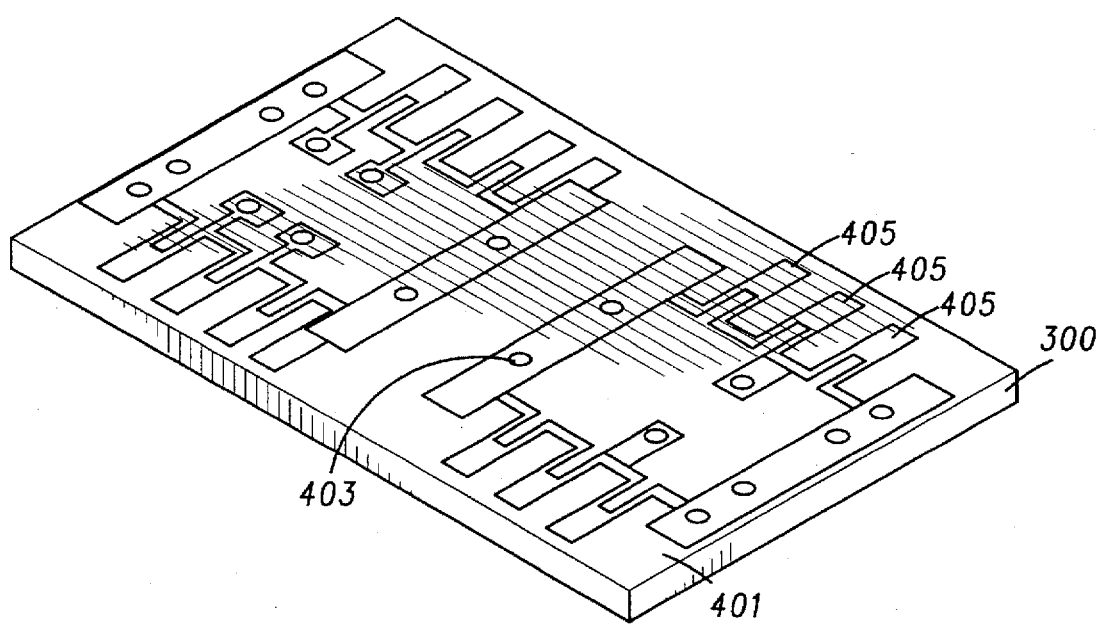
FIG. 4 shows a top view of a laser tunable semiconductor device assembly in accordance with a preferred embodiment of the present invention.

FIG. 4 shows a top view of a LSDA 300 in accordance with a preferred embodiment of the present invention. As is evident in FIG. 4, a metalization pattern exists on the top surface 401 of the LSDA 300. This metalization pattern consists of electrically connected laser tuning pads 405, which are brought into electrical connection with the metalized paths 301 existing on the bottom surface 303 of the LSDA 300 through via holes 403 existing within the LSDA 300. In the preferred embodiment the metalization is comprised of copper. The laser tuning pads 405 allows RF transistor 100 to be laser tuned and The laser tuning pads 405 allow an RF transistor 100 to be laser tuned and final tested during the same process without the need for the additional insertion into an electrical test circuit and final testing process associated with the conventional chip-and-wire process. Additionally, using an "on-line" testing process will force rapid process control feedback during the processing of the device, with-in-process scrap.

Figure 5:
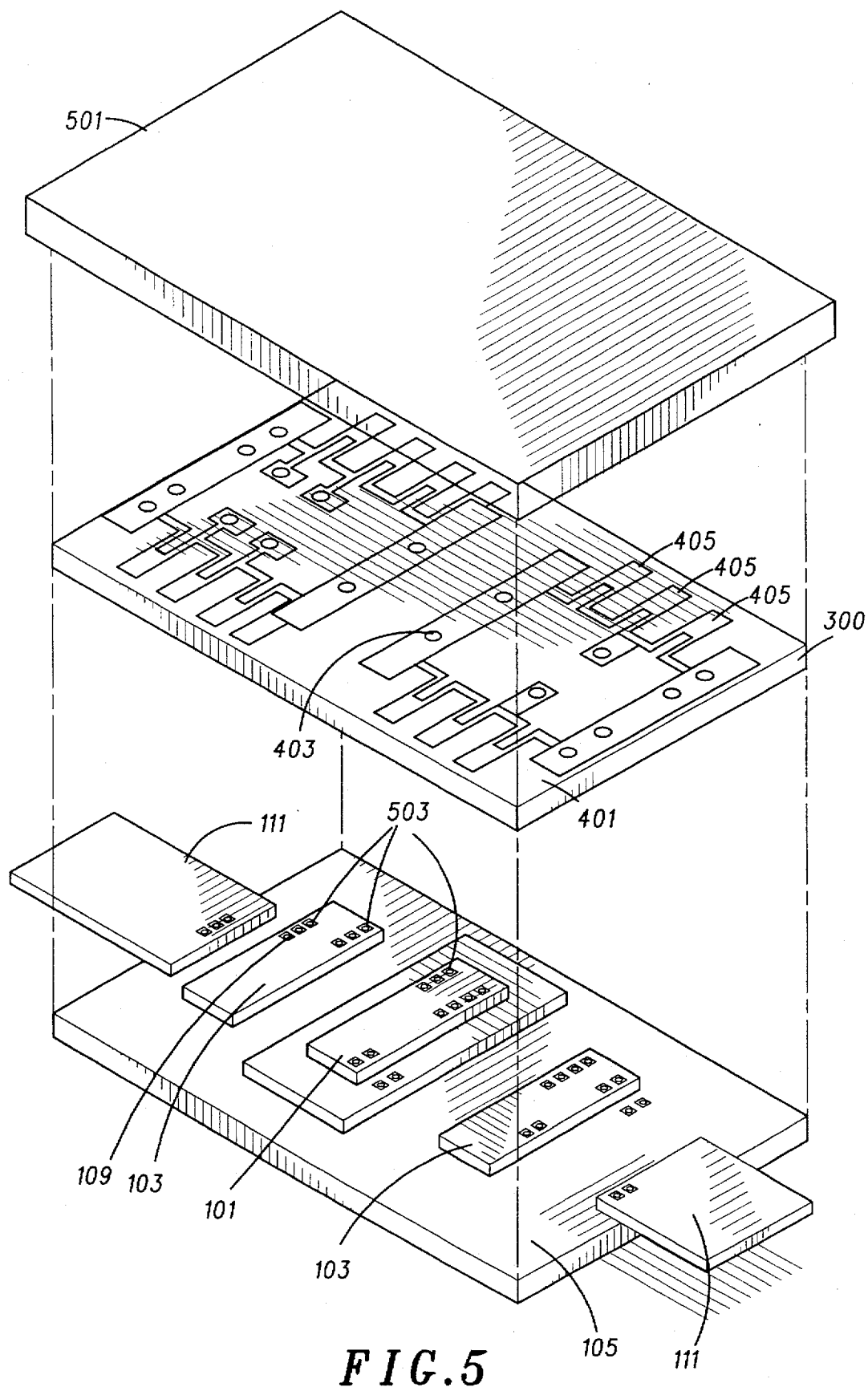
FIG. 5 shows an exploded view of a mounting substrate, semiconductor devices, laser tunable semiconductor device assembly, and cap in accordance with the invention.

FIG. 5 shows an exploded view of a mounting substrate 105, semiconductor devices 101, 103, LSDA 300, and cap 501 in accordance with a preferred embodiment of the invention. As can be seen in FIG. 5 the semiconductor devices 101, 103 now utilize solder bumps 503 deposited on the semiconductor bonding pads 109. During assembly, semiconductor devices 101 and 103 may be attached to the mounting substrate 105 using conventional die bonding and placement techniques. Next, the LSDA 300 is aligned to the semiconductor devices 101, 103 and all interconnections may be made simultaneously by subsequently reflowing the solder bumps 503. Although in the preferred embodiment the solder bumps 503 are deposited on the semiconductor bonding pads 109, the same result may be obtained by depositing the solder bumps 503 directly to the bonding pads 305 of the LSDA 300.

After electrical connection, a dielectric material (not shown) may be applied between the semiconductor devices 101, 103 and the LSDA 300 in order to protect the solder joint interconnection. The dielectric material is typically an epoxy resin with a coefficient of thermal expansion similar to that of the solder, in order to improve thermal fatigue life. In the preferred embodiment the epoxy resin is applied around the perimeter of the semiconductor devices 101, 103. Next, the semiconductor devices 101, 103 are laser tuned and tested. Finally, after the device has been laser tuned and final tested, a cap 501 is placed on the device.

The invention, in its broader aspects, is not limited to the specific details, representative apparatus, and illustrative examples shown and described above. Various modifications and variations can be made to the above specification without departing from the scope or spirit of the present invention, and it is intended that the present invention cover all such modifications and variations provided they come within the scope of the following claims and their equivalents.

What I claim is:

1. An apparatus for mounting a flip-chip semiconductor device, comprising:

a first substrate having a first substrate side and a second substrate side, a first substrate metalization pattern existing on the first substrate side, a second substrate metalization pattern existing on the second substrate side, the second substrate metalization pattern comprising bonding pads making electrical contact to the first substrate metalization pattern wherein the electrical contact between the second substrate metalization pattern and the first substrate metalization pattern is made through a plurality of via holes existing within the first substrate;

a plurality of tuning structures existing on the first substrate side, making electrical contact to the first and the second substrate metalization patterns; and a plurality of flip-chip semiconductor devices, wherein a first side of the flip-chip semiconductor devices is electrically connected to the first and the second substrate metalization via solder bumps mated with the bonding pads.

2. The apparatus of claim 1, further comprising an epoxy resin material substantially filling a space between the semiconductor device and the substrate.

3. The apparatus of claim 1, further comprising a second substrate, wherein the second substrate is mounted to a second side of the semiconductor device.

4. The apparatus of claim 1, wherein the semiconductor device is a transistor die.

5. The apparatus of claim 1, wherein the semiconductor device is a MOS capacitor.

6. The apparatus of claim 1, wherein the flip-chip semiconductor devices further comprise a solder-type connection between the first substrate and the semiconductor devices.

7. An apparatus for mounting a plurality of flip-chip semiconductor devices, comprising:

a first substrate having a first substrate side and a second substrate side, a first substrate metalization pattern existing on the first substrate side, a second substrate metalization pattern existing on the second substrate side, the second substrate metalization pattern comprising bonding pads and making electrical contact to the first substrate metalization pattern wherein the electrical contact between the second substrate metalization pattern and the first substrate metalization pattern is made through a plurality of via holes existing within the first substrate;

a plurality of tunable structures existing on the first substrate side, making electrical contact to the first and the second substrate metalization patterns; and a plurality of flip-chip semiconductor devices electrically connected to the second substrate metalization patterns via solder bumps mated with the bonding pads.

8. The apparatus of claim 7, further comprising an epoxy resin material substantially filling a space between the plurality of semiconductor devices and the substrate.

9. The apparatus of claim 7, further comprising a second substrate, wherein the second substrate is mounted to the plurality of semiconductor devices.

10. The apparatus of claim 7, wherein the plurality of semiconductor devices are selected from the group consisting essentially of a transistor die, and a MOS capacitor.

11. The apparatus of claim 7, wherein the flip-chip semiconductor devices further comprise a solder-type connection between the first substrate and the semiconductor devices.

* * * * *